United States Patent
Shacter

(10) Patent No.: US 6,710,660 B1
(45) Date of Patent: Mar. 23, 2004

(54) CLASS B POWER BUFFER WITH RAIL TO RAIL OUTPUT SWING AND SMALL DEADBAND

(75) Inventor: Stuart B. Shacter, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/246,068

(22) Filed: Sep. 17, 2002

(51) Int. Cl.$^7$ .............................. H03F 3/45; H03F 3/18
(52) U.S. Cl. ...................................... 330/255; 330/263
(58) Field of Search ........................... 330/77, 81, 82, 330/255, 262, 263, 265

(56) References Cited

U.S. PATENT DOCUMENTS 5,909,146 A * 6/1999 Okada ........................ 330/255
6,262,633 B1 * 7/2001 Close ......................... 330/255
6,285,256 B1 * 9/2001 Wong ......................... 330/255

OTHER PUBLICATIONS

"A Comparison of Differential Termination Techniques", *National Semiconductor Corporation*, AN–903, Aug. 1993, pp. 1–10.

"DDR Termination Regulator", *National Semiconductor Corporation*, LM2995, Oct. 2002, pp. 1–12.

* cited by examiner

Primary Examiner—Khanh Van Nguyen
(74) Attorney, Agent, or Firm—Mark R. Hennings; Merchant & Gould

(57) ABSTRACT

A circuit is arranged as a class B amplifier with a rail-to-rail output swing and a small deadband. The circuit has two parallel input stages that each use an amplifier configured as a unity gain voltage follower. The output of each stage drives a high current output transistor. The output transistors are complementary transistors arranged in a common source configuration. The common source configuration operates as a complementary class B amplifier, which conducts no quiescent bias current. An offset voltage is introduced in each input stage, which creates a small deadband in the output voltage as it switches between sinking current and sourcing current. The offset voltage is selected to ensure that the output transistors are not both simultaneously activated.

18 Claims, 2 Drawing Sheets

CLASS B POWER BUFFER WITH RAIL TO RAIL OUTPUT SWING AND SMALL DEADBAND

FIELD OF THE INVENTION

The present invention relates generally to electronic amplifier circuits, and more particularly to class B amplifier circuits.

BACKGROUND OF THE INVENTION

Class A amplifier circuits often contain two parallel input stages. Each input stage may have a power operational amplifier that is configured as a unity gain voltage follower. Each input stage typically drives a high current output transistor. The output transistors are connected in common source configuration to operate as a complementary class A output stage, which conducts a quiescent bias current. An example of a class A amplifier circuit 100 is shown in FIG. 1.

FIG. 1 is a schematic of a conventional class A amplifier circuit (100). The class A amplifier circuit 100 includes amplifiers X1 and X2 and power transistors M1 and M2.

Amplifier X1 has an inverting input that is coupled to node Vin, a non-inverting input that is coupled to node Vout, and an output that is coupled to node N1. Amplifier X2 has an inverting input that is coupled to node Vin, a non-inverting input that is coupled to node Vout, an output that is coupled to node N2. Transistor M1 has a source that is coupled to a first voltage (such as VDD), a gate that is coupled to node N1, and the drain that is coupled to node Vout. Transistor M2 has a source that is coupled to a second voltage (such as ground), a gate that is coupled to node N2, and a drain that is coupled to node Vout.

Amplifiers X1 and X2 form the input stage of circuit 100. Amplifiers X1 and X2 are arranged as voltage followers to produce voltages at nodes N1 and N2 in response to the voltage present at node Vin. Transistors M1 and M2 conduct a quiescent bias current, notwithstanding the gate voltages at nodes N1 and N2 or any load that may be coupled to node Vout.

SUMMARY OF THE INVENTION

The present invention is directed towards a circuit for providing class B amplification with a rail-to-rail output swing while having a small deadband. The circuit has two parallel input stages that each use an amplifier configured as a unity gain voltage follower. The output of each stage drives a high current output transistor. The output transistors are complementary transistors arranged in a common source configuration. The common source configuration operates as a complementary class B amplifier, which conducts no quiescent bias current. An offset voltage is introduced in each input stage, which creates a small deadband in the output voltage as it switches between sinking current and sourcing current. The offset voltage is selected to ensure that the output transistors are not both simultaneously activated.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENTS

Figure 1:
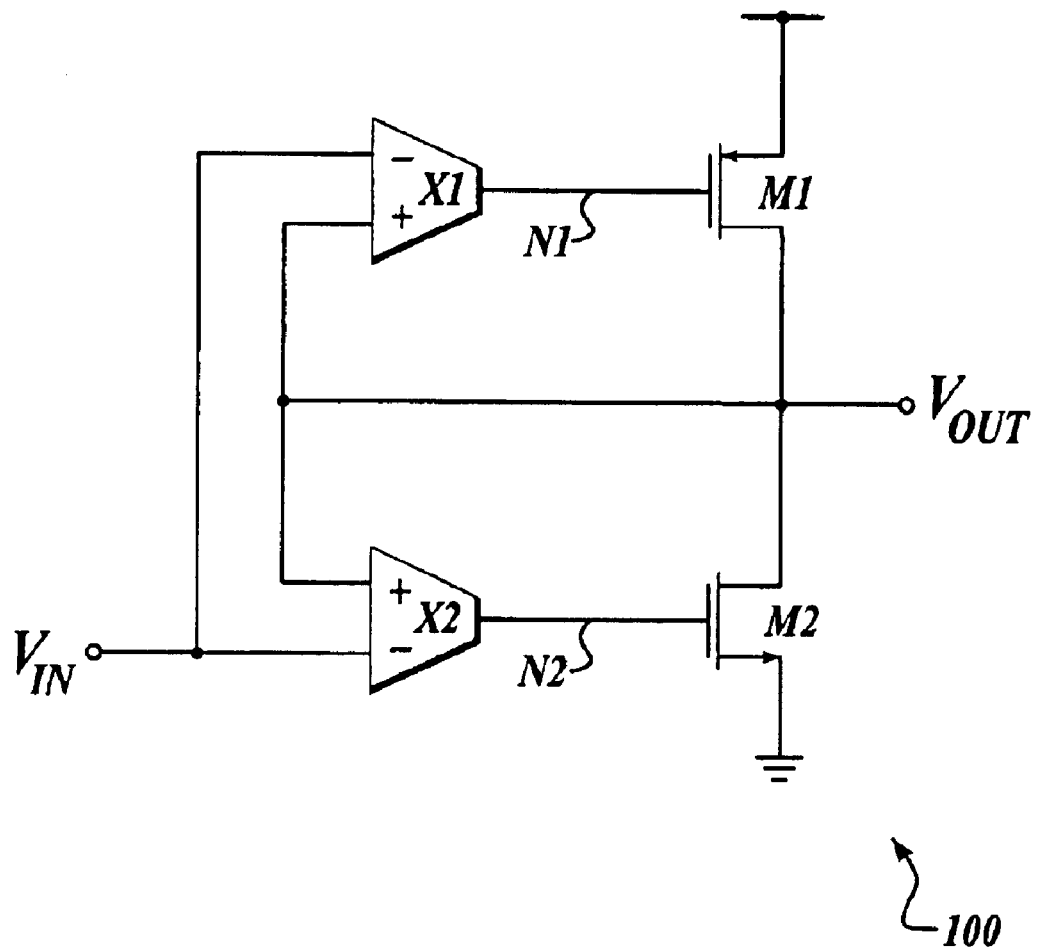
FIG. 1 is a schematic of a conventional class A amplifier circuit.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

Amplifier circuits used in input stages of differential amplifiers are often "nonideal" and have an input offset voltage with respect to the ideal performance of the amplifier circuit. The amount of offset voltage can be controlled by, for example, choosing transistors of selected sizes. However, unintentional variations in offset voltages are introduced by variations in the process used to manufacture the amplifier circuit. The unintentional variations in the offset voltages can be empidcally measured and a statistical distribution of the offset variations can be determined. A maximum expected input offset voltage can be determined from the statistical distribution. The maximum expected input offset voltage is used in accordance with the present invention to select offset voltages to compensate for the unintentional offset voltages in a class B amplifier circuit.

The present invention is directed towards a circuit for providing class B amplification with a rail-to-rail output swing while having a small deadband. The circuit has two parallel input stages that each use an amplifier configured as a unity gain voltage follower. The output of each stage drives a high current output transistor. The output transistors are complementary transistors arranged in a common source configuration. The common source configuration operates as a complementary class B amplifier, which conducts no quiescent bias current. An offset voltage is introduced in each input stage, which creates a small deadband in the output voltage as it switches between sinking current and sourcing current. The offset voltage is selected to ensure that the output transistors are not both simultaneously activated.

Figure 2:
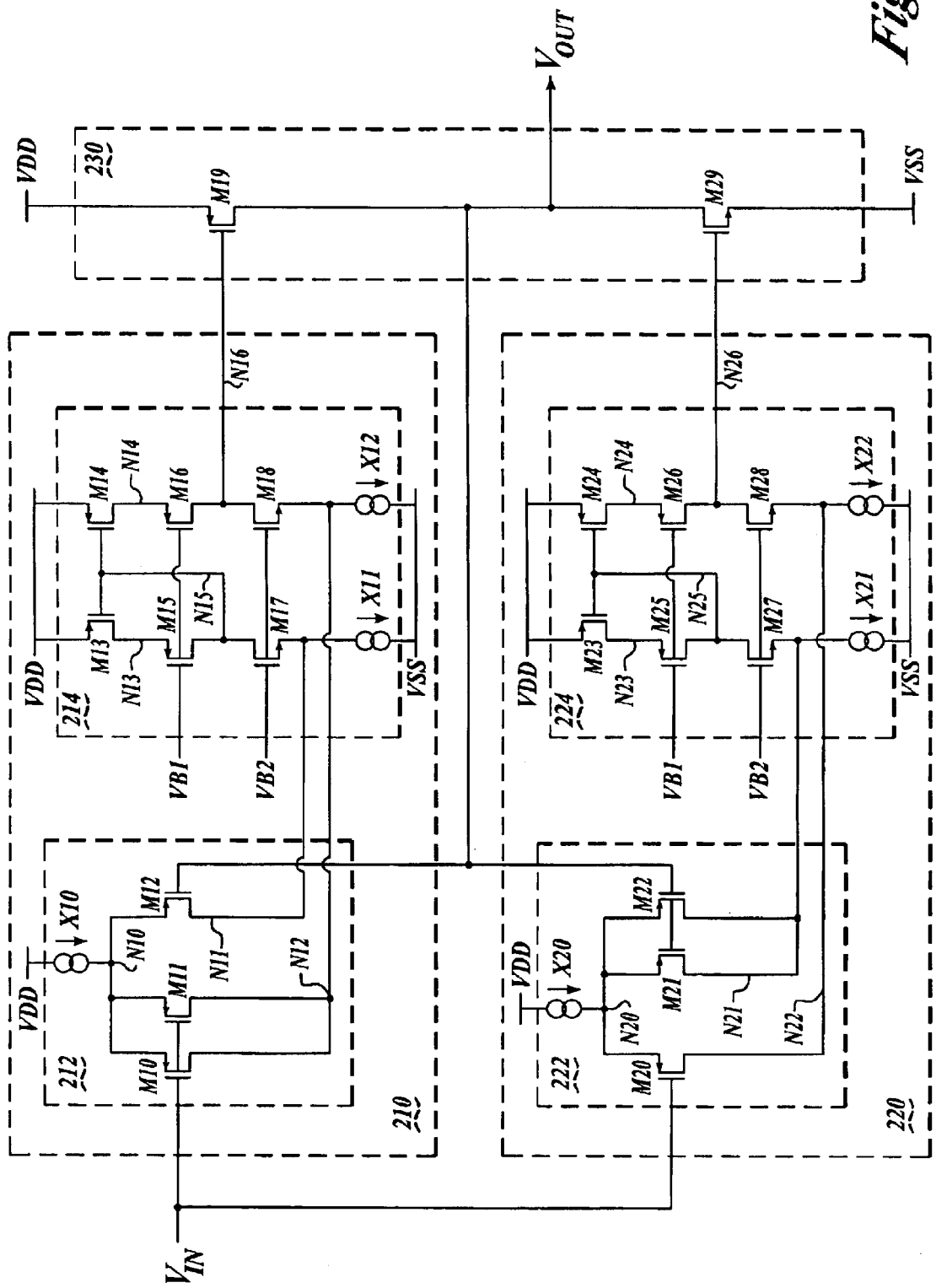
FIG. 2 is a schematic of an example class B amplifier circuit having offset voltages in the input stage in accordance with the present invention.

FIG. 2 is a schematic of an example class B amplifier circuit having offset voltages in the input stage in accordance with the present invention. Amplifier circuit 200 includes input stages 210 and 220 and output stage 230. Input stage 210 comprises input buffer 212 and folded cascode amplifier 214. Input buffer 212 comprises current source X10 and transistors M10 through M12. Folded cascade amplifier 214 comprises current sources X11 and X12 and transistors M13 through M18. Input stage 220 comprises input buffer 222 and folded cascode amplifier 224. Input buffer 222 comprises current source X20 and transistors M20 through M22. Folded cascode amplifier 224 comprises current sources X21 and X22 and transistors M23 through M28. Output stage 230 comprises transistors and M19 and M29.

In input buffer 212, the positive terminal of current source X10 is coupled to a first voltage (such as VDD). The negative terminal of current source X10 is coupled to node N10. The sources of transistors M10 through M12 are coupled to node N10. The gates of transistors M10 and M11 are coupled to node Vin. The gate of transistor M12 is coupled to node Vout. The drains of transistors M10 and M11 are coupled to node N12. The drain of transistor M12 is coupled to node N11.

In input buffer 222, the positive terminal of current source X20 is coupled to a first voltage (such as VDD). The negative terminal of current source X20 is coupled to node N20. The sources of transistors M20 through M22 are coupled to node N20. The gates of transistors M20 and M21 are coupled to node Vin. The gate of transistor M22 is coupled to node Vout. The drain of transistor M20 is coupled to node N22. The drains of transistors M21 and M22 are coupled to node N21.

In amplifier 214, the sources of transistors M13 and M14 are coupled to a first voltage (such as VDD). The gates of transistors M13 and M14 are coupled to node N15. The drain of transistor M13 is coupled to node N13. The drain of transistor M14 is coupled to node N14. The source of transistor M15 is coupled to node N13. The source of transistor M16 is coupled to node N14. The gates of transistors M15 and M16 are coupled to a first bias voltage (such as VB1). The drain of transistor M15 is coupled to node N15. The drain of transistor M16 is coupled to node N16. The drain of transistor M17 is coupled to node N15. The drain of transistor M18 is coupled to node N16. The gates of transistors M17 and M18 are coupled to a second bias voltage (such as VB2). The source of transistor M17 is coupled to node N11. The source of transistor M18 is coupled to node N12. The positive terminal of current source X11 is coupled to node N11. The positive terminal of current source X12 is coupled to node N12. The negative terminals of current sources X11 and X12 are coupled to a second voltage (such as VSS).

In amplifier 224, the sources of transistors M23 and M24 are coupled to a first voltage (such as VDD). The gates of transistors M23 and M24 are coupled to node N25. The drain of transistor M23 is coupled to node N23. The drain of transistor M24 is coupled to node N24. The source of transistor M25 is coupled to node N23. The source of transistor M26 is coupled to node N24. The gates of transistors M25 and M26 are coupled to a first bias voltage (such as VB1). The drain of transistor M25 is coupled to node N25. The drain of transistor M26 is coupled to node N26. The drain of transistor M27 is coupled to node N25. The drain of transistor M28 is coupled to node N26. The gates of transistors M27 and M28 are coupled to a second bias voltage (such as VB2). The source of transistor M27 is coupled to node N21. The source of transistor M28 is coupled to node N22. The positive terinal of current source X11 is coupled to node N21. The positive terminal of current source X12 is coupled to node N22. The negative terminals of current sources X11 and X12 are coupled to a second voltage (such as VSS).

In output stage 230, the source of transistor M19 is coupled to a first voltage (such as VDD). The gate of transistor M19 is coupled to node N16. The drain of transistor M19 is coupled to node Vout. The drain of transistor M29 is coupled to node Vout. The gate of transistor M29 is coupled to node N26. The source of transistor M29 is coupled to a second voltage (such as VSS).

Briefly stated, amplifiers 214 and 224 are configured as voltage followers. Amplifiers 214 and 224 are arranged to activate (in an alternate fashion) one of the power output transistors (M19 and M29) in output stage 230 when a load draws current through node Vout. Power output transistors M19 and M29 are arranged to source or sink current that is drawn from node Vout. Amplifiers 214 and 224 are arranged to deactivate power transistors M11 and M12 when no current is drawn from node Vout by a load.

In operation, an input signal to be amplified is coupled to node Vin. Node Vin is coupled to the gates of transistors M10 and M11 of input buffer 212 and to the gate of transistor M20 of input buffer 222. The sizes of transistors M10, M11, and M20 (and related transistors M12, M21, and M22) are selected to introduce a offset voltage (compensation voltage) to the input signal. The compensation voltage is used to compensate for unintentional variations in offset voltages that result from process variations.

The amount of compensation voltage applied to the input signal is twice the maximum expected input offset voltage. Transistors M10 and M11 (operating with transistor M12) add a compensation voltage that is at least the maximum expected input offset voltage. The compensation voltage is added to the input signal relative to the signal present at node Vout. Transistor M20 (operating with transistors M21 and M22) subtracts a compensation voltage that is at least the maximum expected input offset voltage. The compensation voltage is subtracted from the input signal relative to the signal present at node Vout.

The combined compensation voltages produce a deadband voltage (for ideal circuits that contain no unintentional offset voltages) that is twice the maximum expected input offset voltages. The deadband voltage is minimized by selecting compensation voltages that are at least equal to the maximum expected input offset voltage.

For example, in a circuit made according to a particular process, a maximum expected input offset voltage is five millivolts. Input buffer 212 may have a compensation voltage of positive five millivolts and input buffer 222 may have a compensation voltage of negative five millivolts. Without voltage compensation, there would be a 10 millivolt band in which both output transistors would be activated, which would result in undesirable power consumption even in the absence of a load for an output current. The compensation voltages are selected such that the offset voltages are adjusted by at least five millivolts each. Adjusting a first input voltage by a positive five millivolts and the second input voltage by a negative five millivolts ensures that there will be no overlap between the voltage at which the source output transistor is activated and the voltage at which the sink output transistor is deactivated.

The compensation voltages cause the voltage followers to deactivate power transistors M11 and M12 when no load current is present. Node Vout floats when power transistors M11 and M12 are deactivated and no load is present (which would draw a load current) at node Vout. The presence of a load current causes the voltage at node Vout to change. The change in the voltage at node Vout is adjusted by input buffers 212 and 222, which causes the voltage followers to increase the gate voltage of the output transistor that is required to either sink or source the output current.

The voltage compensated input signal is output from input buffer 212 and 222 as first and second differential signals. The differential signals are used to drive differential amplifiers for driving complementary power output transistors. The first voltage compensated input signal is output from input buffer 212 at node N11 and node N12. In an example embodiment, the first voltage compensated input signal is coupled to a differential amplifier such as folded cascode amplifier 214. An output of amplifier 214 is used to drive a P-type power output transistor such as M19. The second voltage compensated input signal is output from input buffer 222 at node N21 and node N22. In an example embodiment, the second voltage compensated signal is coupled to a differential amplifier such as folded cascode amplifier 224. The output of amplifier 224 is used to drive a N-type power output transistor such as M29.

Transistors M19 and M29 of output stage 230 form a complementary pair of transistors for sourcing or sinking current from node Vout.

Other embodiments of the invention are possible without departing from the spirit and scope of the invention. For example, a compensation voltage that is twice the maximum expected input offset voltage may be applied using a single input buffer, rather than by using both input buffers for the chip. Alternatively, two input buffers can be used where each buffer provides a different compensation voltage, with the total of the compensation voltages being equal to twice the maximum expected input offset voltage. Additionally, a total compensation voltage that is greater than twice the maximum expected input offset voltage can be used, although doing so results in undesirable distortion of the output at node Vout.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An amplifier having a maximum expected input offset voltage, comprising:
   a first and a second output transistor, wherein the first and second output transistors are configured to operate as a complementary pair to produce an output signal, wherein the first output transistor is configured to conduct in response to a first drive signal, and wherein the second output transistor is configured to conduct in response to a second drive signal; and
   a first and a second input stage, wherein the first input stage is configured to receive an input signal and the output signal and produce the first drive signal in response thereto, wherein the second input stage is configured to receive the input signal and the output signal and produce the second drive signal in response thereto, and wherein the first and second input stages are configured to add a total compensation voltage to the received input and received output signals wherein the total compensated voltage is at least equal to twice the maximum expected input offset voltage whereby only one of the first and second output transistors is expected to conduct at a time.

2. The amplifier of claim 1, wherein the total compensation voltage is substantially equal to twice the maximum expected input offset voltage.

3. The amplifier of claim 1, wherein the first input stage is configured to produce a first compensation voltage that is substantially equal to a second compensation voltage that is produced by the second input stage.

4. The amplifier of claim 1, wherein the first input stage is configured to produce a first compensation voltage that is greater than a second compensation voltage that is produced by the second input stage.

5. The amplifier of claim 4, wherein the sum of the first and second compensation voltages is substantially equal to twice the maximum expected input offset voltage.

6. The first input stage of claim 1, further comprising a first folded cascode differential amplifier that is configured to produce the first drive signal.

7. The first input stage of claim 1, further comprising a first input buffer that is configured to drive the first folded cascode differential amplifier.

8. A circuit for minimizing a deadband of a class B power buffer having a maximum expected input offset voltage, comprising:
   means for receiving an input signal;
   means for producing an output signal by using a complementary pair of transistors, wherein the complementary pair of transistors comprises a first transistor and a second transistor, wherein the first transistor operates in response to a first drive signal, and wherein the second transistor operates in response to a second drive signal;
   means for producing the first drive signal in response to an input signal and the output signal;
   means for producing the second drive signal in response to the input signal and the output signal; and
   means for adding a total compensation voltage to the received input signal and the produced output signal wherein the total compensated voltage is at least equal to twice the maximum expected input offset voltage.

9. The circuit of claim 8, wherein the total compensation voltage is substantially equal to twice the maximum expected input offset voltage.

10. The circuit of claim 8, wherein the input signal receiving means produces a first compensation voltage that is substantially equal to a second compensation voltage that is produced by a second input stage.

11. The circuit of claim 8, wherein the input signal receiving means produces a first compensation voltage that is larger than a second compensation voltage that is produced by a second stage.

12. The circuit of claim 11, wherein the sum of the produced first and second compensation voltages is substantially equal to twice the maximum expected input offset voltage.

13. A method for minimizing a deadband of a class B power buffer having a maximum expected input offset voltage, comprising:
   receiving an input signal;
   producing an output signal by using a complementary pair of transistors, wherein the complementary pair of transistors comprises a first transistor and a second transistor, wherein the first transistor operates in response to a first drive signal, and wherein the second transistor operates in response to a second drive signal;
   producing the first drive signal in response to an input signal and the output signal;
   producing the second drive signal in response to the input signal and the output signal; and adding a total compensation voltage to the received input signal and the produced output signal wherein the total compensated voltage is at least equal to twice the maximum expected input offset voltage.

14. The method of claim 13, wherein the total compensation voltage is substantially equal to twice the maximum expected input offset voltage.

15. The method of claim 13, further comprising using a first input stage to produce a first compensation voltage that is substantially equal to a second compensation voltage that is produced by a second input stage.

16. The method of claim 13, further comprising using a first input stage to produce a first compensation voltage that is larger than a second compensation voltage that is produced by a second stage.

17. The method of claim 16, wherein the sum of the produced first and second compensation voltages is substantially equal to twice the maximum expected input offset voltage.

18. The method of claim 13, further comprising:

using a first input buffer to drive a first folded cascode differential amplifier; and using the first folded cascode differential amplifier to produce the first drive signal.

* * * * *